United States Patent [19]

Majima

[11] Patent Number: 5,396,360
[45] Date of Patent: Mar. 7, 1995

[54] WAVELENGTH-MULTIPLEXED OPTICAL COMMUNICATION SYSTEM AND OPTICAL AMPLIFIER USED THEREFOR

[75] Inventor: Masao Majima, Atsugi, Japan

[73] Assignee: Canon Kabushiki Kaisha, Tokyo, Japan

[21] Appl. No.: 240,818

[22] Filed: May 11, 1994

Related U.S. Application Data

[63] Continuation of Ser. No. 730,445, Jul. 16, 1991, abandoned.

[30] Foreign Application Priority Data

Jul. 20, 1990 [JP] Japan ................... 2-193432

[51] Int. Cl.⁶ ............ H04J 14/02; H04B 10/02; H01S 3/00
[52] U.S. Cl. ................... 359/133; 359/161; 359/176; 359/174; 359/115; 359/124; 359/349; 359/337
[58] Field of Search ............ 359/154, 160, 179, 194, 359/161, 114, 115, 124, 125, 173, 174, 187, 188, 133, 334, 337, 344, 349, 176

[56] References Cited

U.S. PATENT DOCUMENTS

| | | | |
|---|---|---|---|
| 3,887,876 | 6/1975 | Zeidler | 330/4.3 |
| 4,680,769 | 7/1987 | Miller | 372/50 |
| 4,786,129 | 11/1988 | Webb | 356/345 |
| 4,797,879 | 1/1989 | Habbab et al. | 359/121 |
| 4,952,017 | 8/1990 | Henry et al. | 350/96.15 |
| 4,958,354 | 9/1990 | Urakami et al. | 372/29 |
| 5,003,268 | 3/1991 | Tsuchiya | 330/4.3 |
| 5,117,196 | 3/1992 | Epworth et al. | 359/333 |

FOREIGN PATENT DOCUMENTS

| | | | |
|---|---|---|---|
| 0445364 | 10/1990 | Germany | 357/124 |
| 60-84034 | 5/1985 | Japan | 359/194 |
| 61-075326 | 4/1986 | Japan . | |
| 62-279735 | 4/1987 | Japan . | |
| 01034030 | 2/1989 | Japan . | |
| 02119328 | 5/1990 | Japan . | |

OTHER PUBLICATIONS

"Passive Optical Subscriber Loops With Multiaccess" by Yih–Kang Maurice Lin et al., *Journal of Lightwave Technology*, vol. 7, No. 11, Nov. 1989, No. 11, New York USA, pp. 1769–1777.

*Primary Examiner*—Richard E. Chilcot, Jr.
*Assistant Examiner*—Rafael Bacares
*Attorney, Agent, or Firm*—Fitzpatrick, Cella, Harper & Scinto

[57] ABSTRACT

An optical communication system comprises: a plurality of optical communication apparatus for communicating signals by using a plurality of communicating lights having different wavelengths; an optical transmitter for transmitting a controlling light having a different wavelength than any of the plurality of wavelengths; an optical transmission line for interconnecting the optical transmitter and the optical communication apparatus to transmit the communicating lights and the controlling light; an optical amplifier for amplifying the communicating lights and the controlling light transmitted over the optical transmission line; and control circuit for discriminating the controlling light amplified by the optical amplifier from the communicating lights and controlling a gain of the optical amplifier to keep a light intensity of the controlling light at a constant level.

23 Claims, 7 Drawing Sheets

WAVELENGTH-MULTIPLEXED OPTICAL COMMUNICATION SYSTEM AND OPTICAL AMPLIFIER USED THEREFOR

This application is a continuation of application Ser. No. 07/730,445, filed Jul. 16, 1991, now abandoned.

BACKGROUND OF THE INVENTION

1. Field of the Invention

The present invention relates to an optical communication system for transmitting and receiving a signal by using a plurality of lights having different wavelengths, and an optical amplifier used for such a system.

2. Related Background Art

An optical fiber transmission system which uses an optical fiber as a transmission line has recently been used in a field of a main channel, a local area network (LAN) or the like to take the place of a prior art transmission system which uses a coaxial cable, because of many advantages such as wide band, low loss and resistance to electromagnetic induction. Among others, a system which uses the wavelength multiplexity has a feature of being capable of transmitting a plurality of signals independently through one transmission line.

In the optical communication system, it is usual to convert a light signal to an electrical signal to reproduce or relay it in order to increase a transmission length or compensate for the attenuation of the light signal at a branch point. However, this method is not appropriate to the system which uses the wavelength multiplex because the respective waves must be separated for each reproduction or relay and they must be converted to electrical signals.

Figure 1:
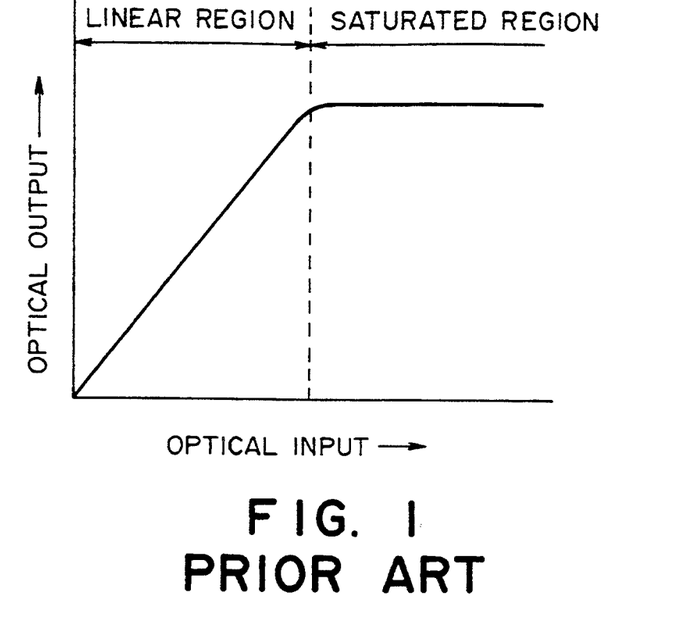
FIG. 1 shows an input/output characteristic of a conventional optical amplifier.

On the other hand, an optical amplifier which has recently been studied vigorously is expected to be appropriate to the wavelength multiplex system. The optical amplifier amplifies input waveforms independently as light signals. FIG. 1 shows a light-input/output characteristic. As seen from FIG. 1, a light output (or optical output) changes substantially in proportion to a light input (or optical input) until the light input reaches a certain level (called a linear region), and when the light input is above the certain level, the light output is substantially constant (called a saturated region).

Figure 2:
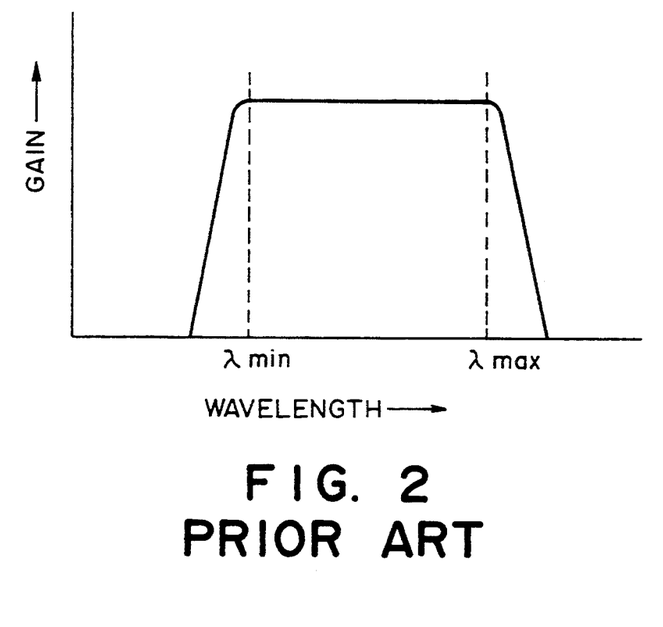
FIG. 2 shows a wavelength dependency of a gain of a optical amplifier used in a wavelength-multiplexed optical communication system.

FIG. 2 shows a wavelength dependency of a gain of the optical amplifier. As seen from FIG. 2, the gain is substantially constant from a wavelength $\lambda \text{min}$ to a wavelength $\lambda \text{max}$.

Thus, the optical amplifier is used while taking the above characteristic into consideration. The optical amplifier includes a semiconductor laser amplifier which has a semiconductor laser structure and is driven by an injection current below a threshold, and an optical fiber amplifier. A gain of the semiconductor laser amplifier is controlled by the injection current while a gain of the optical fiber amplifier is controlled by a pumping light input.

Figure 3:
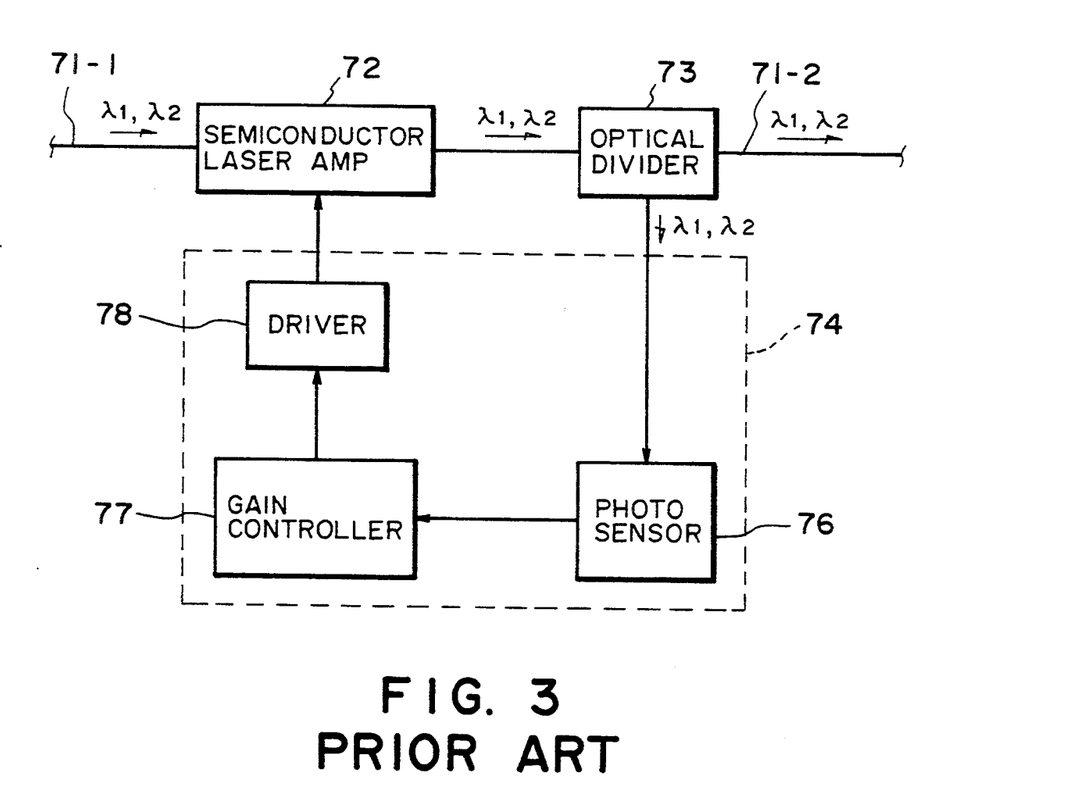
FIG. 3 shows a block diagram of a optical amplifier used in a prior art wavelength-multiplexed optical communication system.

In the optical amplifier, the gain control is effected in order to stabilize the light output. FIG. 3 shows a block diagram of an optical amplifier used in a prior art optical communication system. It uses a semiconductor laser amplifier as an optical amplifier and two waves $\lambda_1$ and $\lambda_2$ are wavelength-multiplexed on a transmission line. A light signal is applied to a semiconductor laser amplifier 72 through an optical fiber 71-1 which is used as a transmission line, and it is amplified thereby and a portion of the amplified light signal is applied to a photo-sensing circuit 76 through an optical power divider 73 while the remaining portion is applied to an optical fiber 71-2 which serves as a transmission line. The photo-sensing circuit 76 has an integration function having a sufficiently longer time constant than a pulse width of the signal light to produce a voltage having an amplitude corresponding to an average light intensity for a period in the order of the time constant. A gain control circuit 77 controls an output current of a driver 78, that is, a drive biasing current in accordance with an output voltage of the photo-sensing circuit 76.

The control is effected such that the output voltage of the photo-sensing circuit 76 is equal to a predetermined level.

In this manner, the light output of the semiconductor laser amplifier 72 when the light signal is applied thereto is always kept constant.

However, the prior art wavelength-multiplexed optical communication system which uses the optical amplifier has the following problems. Since the gain control of the optical amplifier is effected such that the total sum of the light intensities (or optical power) of all wavelengths applied to the optical amplifier is kept constant at the output end of the optical amplifier, it operates on a presumption that all wavelengths multiplexed are always applied to the optical amplifier. The lights are modulated by the transmission signal. Accordingly, when the number of wavelengths applied to the optical amplifier, that is, the number of wavelengths on the transmission line changes, the intensities (or optical power) of the respective wavelengths at the output end of the optical amplifier vary. An example of systems in which such a problem takes place is a packet communication system in which light signals appear in burst on the transmission line.

Figure 4A:
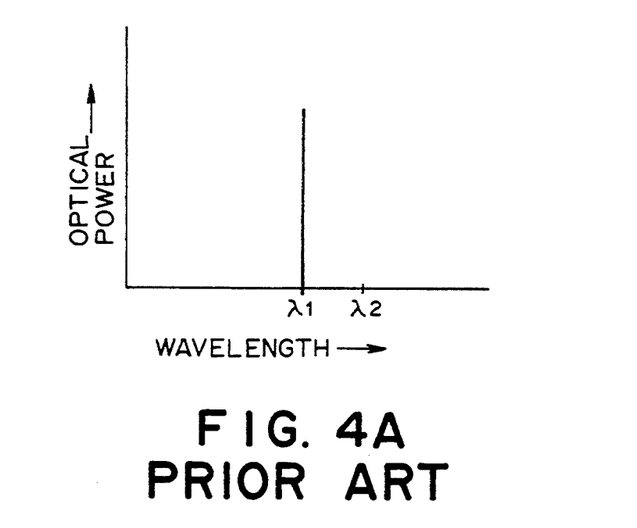
FIGS. 4A and 4B show light intensities of respective wavelengths produced by the optical amplifier of the prior art wavelength-multiplexed light communication system.
Figure 4B:
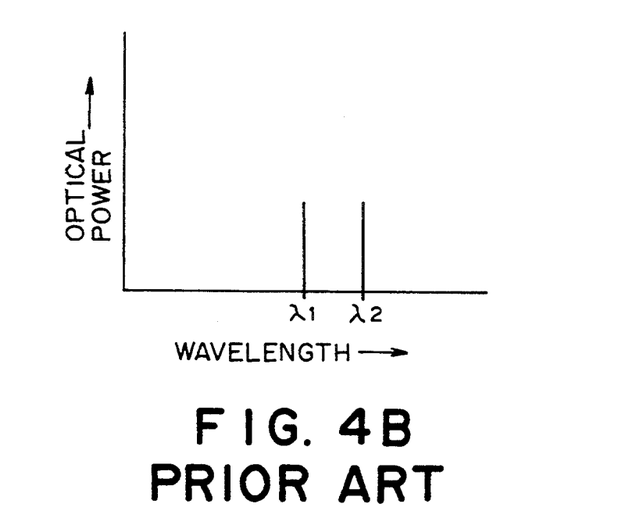

This is explained with reference to FIGS. 4A and 4B, which show light intensities (or optical power) of respective wavelengths at the output end of the optical amplifier in the optical amplification apparatus used in the prior art optical communication system. In the illustrated system, two wavelengths ($\lambda_1$, $\lambda_2$) are multiplexed. In FIG. 4A, only the wavelength $\lambda_1$ is applied to optical amplifier, and in FIG. 4B both wavelengths $\lambda_1$ and $\lambda_2$ are applied. As described above, since the gain is controlled such that the light intensities of all wavelengths at the output end of the optical amplifier is kept constant, the light output for $\lambda_1$ in FIG. 4A is double of that in FIG. 4B. Namely, depending on whether the wavelength $\lambda_2$ is applied to the optical amplifier or not, the output light intensity of the other wavelength $\lambda_1$ varies. The light intensity variation renders a permissible level of the system to the light level smaller. As a result, it is necessary to set a large dynamic range of the photo-detector. As a result, the stabilization effect of the light level on the transmission line by the use of the optical amplifier in the system is reduced. In the present example, the number of wavelengths multiplexed is two, but the light intensity variation increases as the number of wavelengths multiplexed increases.

SUMMARY OF THE INVENTION

It is an object of the present invention to provide a wavelength-multiplexed optical communication system which can control the light intensities of the signal lights of the respective wavelengths at a constant level without regard to the status of the signal lights in the optical transmission line, and an optical amplifier used therefor.

In order to achieve the above object, the optical communication system of the present invention comprises:

a plurality of optical communication apparatuses for communicating signals by using a plurality of communicating lights having different wavelengths;

an optical transmitter for transmitting a controlling light having a different wavelength than any of said plurality of wavelengths;

an optical transmission line for interconnecting said optical transmitter and said optical communication apparatus to transmit the communicating lights and the controlling light;

an optical amplifier for amplifying the communicating lights and the controlling light transmitted over the optical transmission line; and control means for discriminating the controlling light amplified by said optical amplifier from the communicating lights and controlling a gain of said optical amplifier to keep a light intensity of the controlling light at a constant level.

The above object is also achieved by an optical communication method in the above optical communication system, comprising the steps of:

communicating signals among said optical communication apparatus over said optical transmission line by using a plurality of communicating lights having different wavelengths;

transmitting a controlling light having a wavelength different than any of said plurality of wavelengths over said optical transmission line;

amplifying the communicating lights and the controlling light transmitted over said optical transmission line by said optical amplifier; and controlling a gain of said optical amplifier to keep a light intensity of the controlling light amplified by said optical amplifier at a constant level.

The above object is further achieved by an optical amplifier apparatus used in the above light communication system, comprising:

an optical amplifier for amplifying the communicating lights and the controlling light transmitted over the optical transmission line; and control means for discriminating the controlling light amplified by said optical amplifier from the communicating lights and controlling a gain of said optical amplifier to keep a light intensity of the controlling light at a constant level.

In accordance with one aspect of the present invention, the control means in the above optical communication system and the above optical amplifier comprises:

a driver for varying the gain of said light amplifier; an optical power divider for dividing portions of the communicating lights and the controlling light amplified by said optical amplifier; an optical wavelength separator for separating a portion of the controlling light from the light divided by said optical power divider; a photo-sensing circuit for sensing the light separated by said optical wavelength separator; and a gain control circuit for controlling said driver to keep the output of said photo-sensing circuit at a predetermined level.

DETAILED DESCRIPTION OF THE PREFERRED EMBODIMENTS

Figure 5:
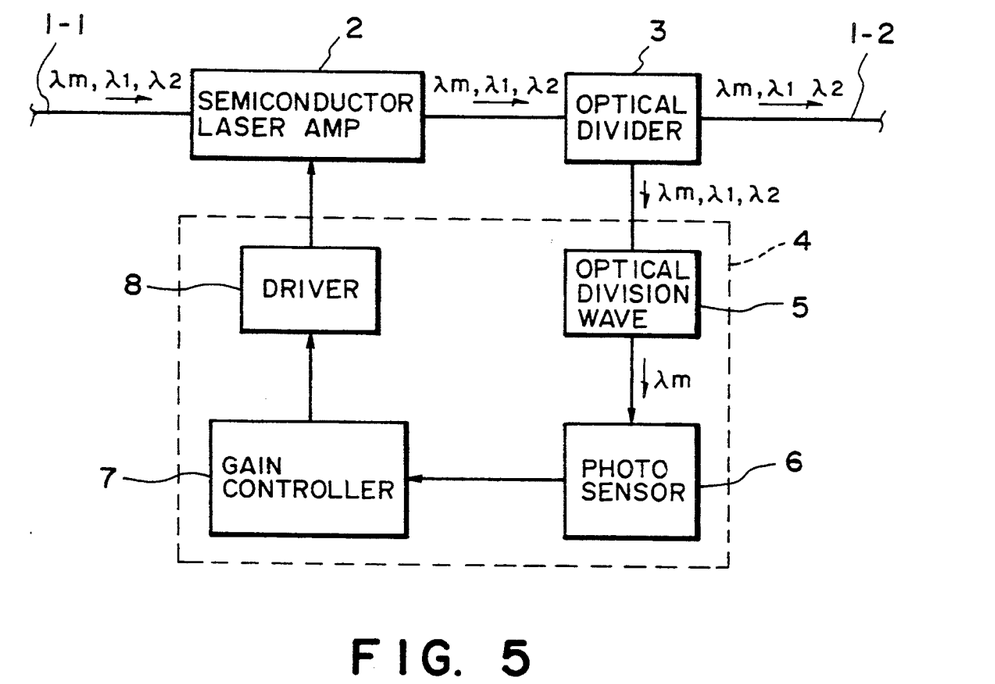
FIG. 5 shows a block diagram of an embodiment of a optical amplifier used in a wavelength-multiplexed optical communication system of the present invention.

FIG. 5 shows a block diagram of an optical amplifier used in the optical communication system of the present invention.

In FIG. 5, numerals 1-1 and 1-2 denote optical fibers which serve as optical transmission lines. The light enters from the optical fiber 1-1 and goes out from the optical fiber 1-2. Numeral 2 denotes a semiconductor laser amplifier which collectively amplifies lights of respective wavelengths which are wavelength-multiplexed with a varying multiplexity. Numeral 3 denotes a light splitter (or power divider) such as a half-mirror which directs a portion of an output light of the amplifier 2 to a gain controller 4 and the rest to the optical wavelength fiber 1-2. The gain controller 4 comprises an optical wave length separator 5, a photo-sensing circuit 6 including a photo-diode, a gain control circuit 7 and a driver 8. The optical wavelength separator 5 separates only a gain controlling light having a wavelength $\lambda m$ of the light from the optical power divider 3 and directs it to the photo-sensing circuit 6. The gain controlling light having the wavelength $\lambda m$ is modulated at the same duty factor as that of other signal lights (wavelengths $\lambda_1$ and $\lambda_2$) and has the equal ON/OFF level.

The photo-sensing circuit 6 has an integration function having a sufficiently longer time constant than a light pulse width of the wavelength $\lambda m$ and produces a voltage having an amplitude corresponding to an average light intensity for a time in the order of the time constant. The gain control circuit 7 controls the output current of the driver 8 which supplies a forward biasing drive current to the semiconductor laser amplifier 2 in accordance with the output voltage of the photo-sensing circuit 6. The control is effected such that the output voltage of the photo-sensing circuit 6 is equal to a predetermined level.

Figure 6:
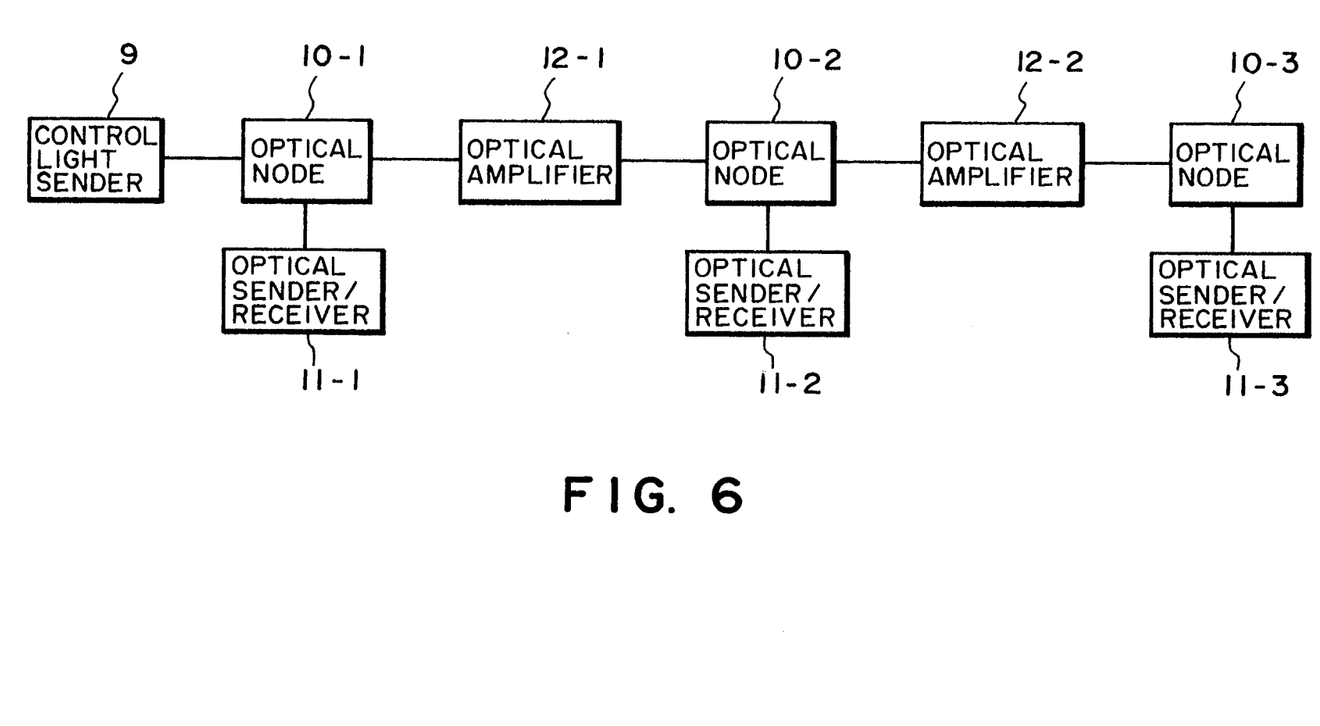
FIG. 6 shows a block diagram of an embodiment of the wavelength-multiplexed optical communication system of the present invention.

FIG. 6 shows a block diagram of one embodiment of the optical communication system of the present invention. It is a unidirectional communication system with the left being upstream and the right being downstream. Solid lines connecting the blocks are optical fibers. Numeral 9 denotes a controlling wavelength transmitter which is located at an uppermost stream end of the transmission line and sends out the light having the wavelength λm for controlling the gain of the semiconductor laser amplifier 2 in the system. Numerals 10-1 to 10-3 denote light nodes including light emitting means and photo-sensing means. They split the light from the transmission line, take in portions thereof and send the communication lights having the wavelengths λ1 and λ2. The light nodes 10-1 to 10-3 take in the signals from the left hand of FIG. 6 and send them out to the right hand. Numerals 11-1 to 11-3 denote optical transmitter/receivers which communicate through the light nodes 10-1 to 10-3. Numerals 12-1 to 12-2 denote optical amplifiers as shown in FIG. 5. They are located between the light nodes 10-1 to 10-3 in order to compensate for the light loss in the light nodes 10-1 to 10-3.

Figure 7A:
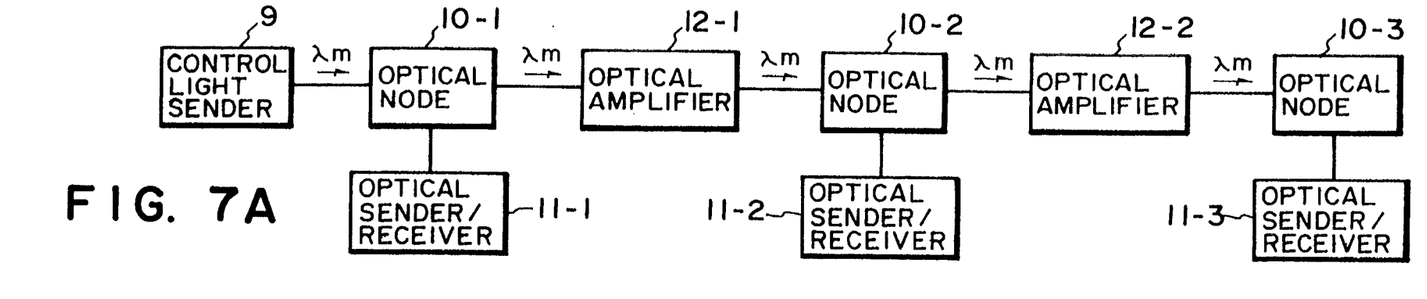
FIGS. 7A to 7C show block diagrams for illustrating lights transmitted in various status of the system of FIG. 6, and FIGS. 8A to 8C show light intensities of respective wavelengths in respective status of FIGS. 7A to 7C.
Figure 7B:
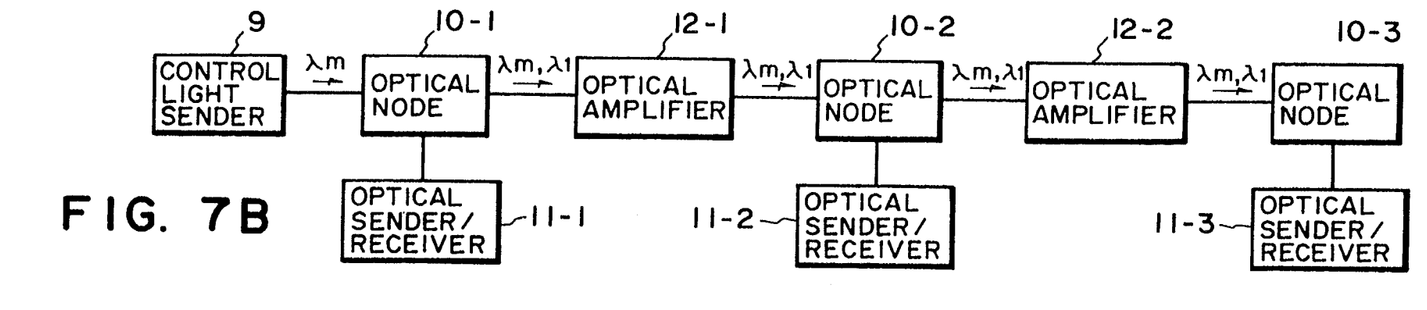
Figure 7C:
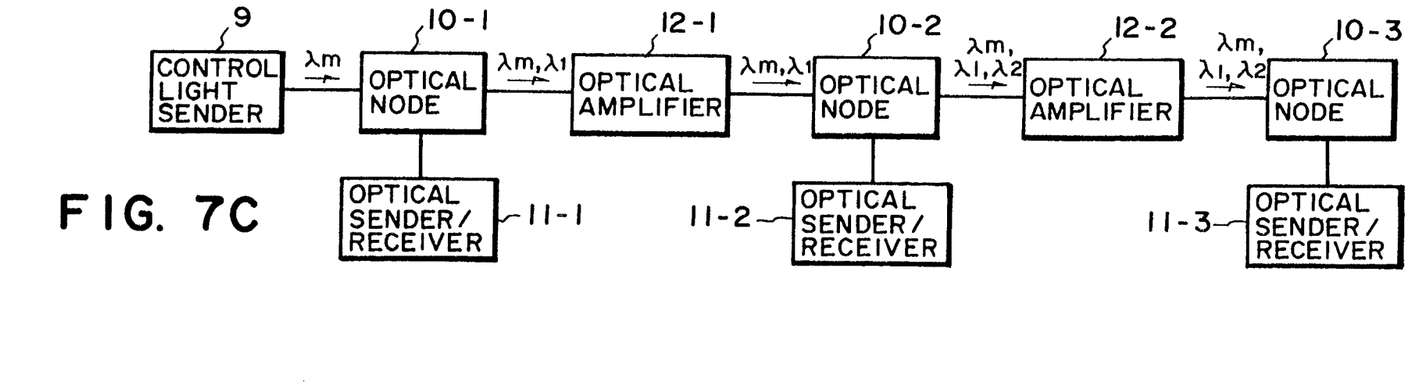

FIGS. 7A to 7C show the transmission status of the wavelengths in the system of FIG. 6. FIGS. 7A, 7B and 7C show three typical states. Arrows show the directions of optical transmission, and the wavelengths propagated through the optical fibers are shown above the arrows. In FIG. 7A, the communication is not effected in the system, in FIG. 7B, a terminal equipment 11-1 transmits the light having the wavelength λ1, and in FIG. 7C a terminal equipment 11-2 also transmits the light having the wavelength λ2.

Figure 8A:
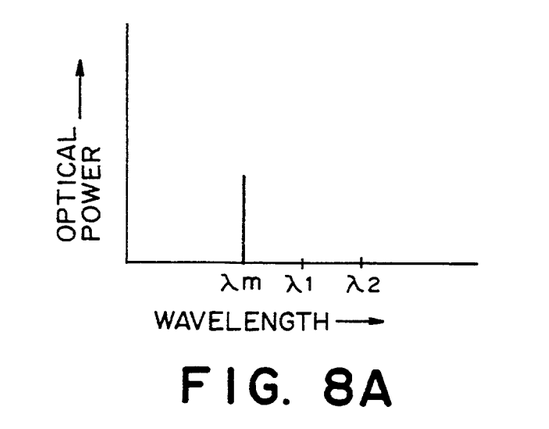
Figure 8B:
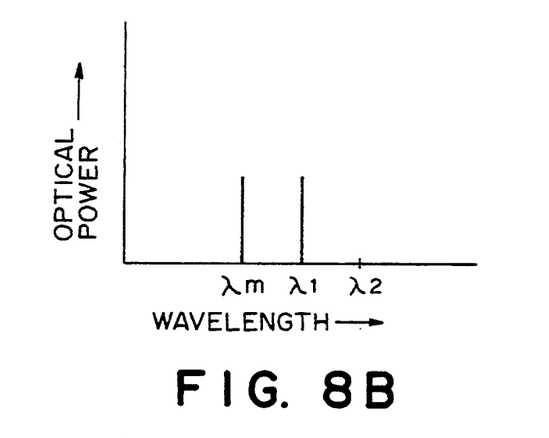
Figure 8C:
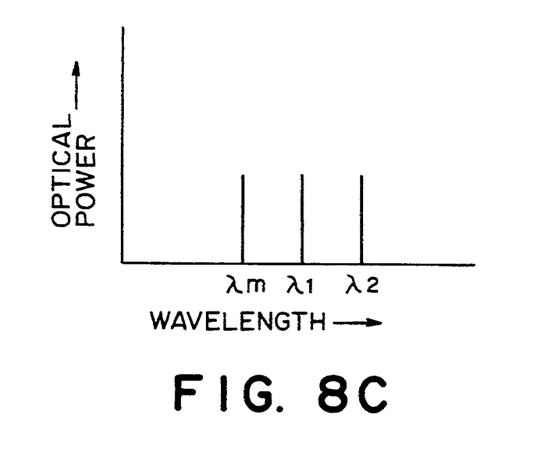

FIGS. 8A to 8C show light outputs for the wavelengths λm, λ1 and λ2 at the output end of the semiconductor laser amplifier 2 used in the optical communication system of the present invention. FIG. 8A shows the light output of the amplifier 2 of the optical amplifiers 12-1 to 12-2 in the status of FIG. 7A, FIG. 8B shows the light output of the amplifier 2 of the optical amplifiers 12-1 to 12-2 in the status of FIG. 7B, and FIG. 8C shows the light output of the amplifier 2 of the optical amplifier 12-2 in the status of FIG. 7C.

The operation of the optical communication system of the present invention is explained with reference to FIGS. 5 to 8C and FIGS. 1 and 2.

In the present embodiment, a travelling wave type semiconductor laser amplifier having a gain spectrum over a relatively broad wavelength band is used as the optical amplifier 2, the wavelengths λ1 and λ2 are used for communication, and the wavelength λm is used to control the gain of the semiconductor laser amplifier 2. Such a semiconductor laser amplifier may be one described in U.S. Pat. Nos. 4,680,769 or 4,952,017.

The ON/OFF levels of the lights having the wavelengths λ1, λ2 and λm are equal, and the gain controlling light having the wavelength λm is modulated at the same duty factor as that of the lights having the wavelengths λ1 and λ2. The sum of the ON levels of the lights having the wavelengths λ1, λ2 and λm is selected to be in the linear region of the semiconductor laser amplifier 2 shown in FIG. 1, and the wavelengths λ1, λ2 and λm are within the wavelength range from λmin to λmax in the wavelength-gain characteristic of the semiconductor laser amplifier 2 shown in FIG. 2. The gains of the semiconductor laser amplifier 2 for the lights having the wavelengths λ1, λ2 and λm are equal.

The controlling light having the wavelength λm is always sent to the transmission line by the controlling wavelength transmitter 9, and the communication wavelengths λ1 and λ2 are used for the communication of discrete signals and they are not always sent to the transmission line. In the examples shown in FIGS. 7A, 7B and 7C, the wavelength applied to the optical amplifier 12-2 at the downstream of the system is only λm in FIG. 7A, λm and λ1 in FIG. 7B, and λm, λ1 and λ2 in FIG. 7C.

In order to keep the light outputs of the respective wavelengths constant in those states, the gain control of the semiconductor laser amplifier 2 is effected in the following manner. In each of the amplifiers 12-1 to 12-2 of the system, the output light is divided and split at the output end of the semiconductor laser amplifier 2 so that only the controlling wavelength λm is applied to the photo-sensing circuit 6. The light having the wavelength λm is applied to the amplifier 2 at a constant level. That is, it is applied as if it is applied to the amplifier 2 directly from the controlling wavelength transmitter 9 so that the amplifier 2 has an equal gain to the respective wavelengths. Thus, the light having the wavelength λm produced by the amplifier 2 directly reflects the gain status of the amplifier 2.

Accordingly, by controlling the output current of the driver 8 by the gain control circuit 7 in the optical amplifier such that the output of the photo-sensing circuit 6 corresponding to the gain status of the amplifier 2 is at a predetermined level, the gain status of the semiconductor laser amplifier 2 is kept at a predetermined status. The above setting corresponds to the output of the photo-sensing circuit 6 produced when the amplifier 2 is in the predetermined status.

The correspondence of the output of the photo-sensing circuit 6 to the gain status of the amplifier 2 is assured by the fact that the integration time constant of the photo-sensing circuit 6 is sufficiently longer than the period of the modulation of λm. Further, since only the wavelength λm is separated and sensed by the photo-sensing circuit 6, the gain control of the semiconductor laser amplifier 2 is not affected by whether the communicating wavelengths λ1 and λ2 are on the transmission line or not.

Accordingly, the light outputs of the wavelength λm at the output ends of the optical amplifiers 11-1 to 11-3 are always constant and equal without regard to the communication status. As described above, since the gains of the semiconductor laser amplifier 2 to the lights having the wavelengths λm, λ1 and λ2 are equal, the fact that the gain for the light having the wavelength λm is kept constant means that the gains for the lights having the communicating wavelengths λ1 and λ2 are also kept constant.

In this manner, the light intensities of the light signals of the respective wavelengths at the output end of the optical amplifier 2 are kept constant even when a discrete signal such as packet communication signal is transmitted, and the wavelength-multiplexed optical communication system with a small variation of output levels of the lights of the respective wavelengths is attained.

In the present embodiment, the ON/OFF levels of the light signals having the wavelengths λm, λ1 and λ2 are equal, although they need not be equal so long as the sum of the ON levels of the respective lights is within the light input range of the linear region of the semiconductor laser amplifier 2 (see FIG. 1).

While two communicating wavelengths λ1 and λ2 are used in the embodiment, the number is not limited to two so long as the sum of the light intensities is within the light input range of the linear region of the semiconductor laser amplifier 2. However, it may be limited by the performance of the semiconductor lasers and the waveform filters in the light nodes 10-1 to 10-3.

The length relation between the controlling wavelength λm and the other wavelengths is not restrictive so long as those wavelengths are within the constant gain area of FIG. 2. While the semiconductor laser amplifier 2 is used as the optical amplifier, an optical fiber amplifier may be used in place thereof. In this case, the driver 8 in the block diagram of the optical amplifier of FIG. 5 is replaced by a light emitting circuit which emits a pumping light to pump the optical fiber amplifier.

While a bus type system configuration in which the optical amplifiers are arranged between the light nodes 10-1 to 10-3 is used in the embodiment, the present invention is applicable to any system so long as a plurality of optical amplifiers are connected in series to the transmission line.

The function of the controlling waveform transmitter 9 which continuously transmits the controlling waveform λm may be performed by the light node 10-1 which is the uppermost stream end or the transmission line.

The signal form or the modulation system of the wavelength λm is not restrictive so long as it is constant, and the modulation system of the other wavelength signals is also not restrictive so long as the time-averaged level is constant.

The present invention is not limited to the illustrated embodiment but many modifications thereof may be made, and the present invention covers all such modifications.

I claim:

1. An optical communication system comprising:
   a plurality of optical communication apparatuses for communicating signals by using a plurality of communicating lights having different wavelengths;
   an optical transmitter for transmitting a controlling light having a different wavelength than any of said plurality of wavelengths, the controlling light being transmitted independently of any communicating from the plurality of optical communication apparatuses;
   an optical transmission line for interconnecting said light transmitter and said optical communication apparatuses to transmit the communicating lights and the controlling light;
   an optical amplifier for amplifying the communicating lights and the controlling light transmitted over the optical transmission line; and
   control means for taking a part of the controlling light amplified by said optical amplifier so that the rest of the controlling light remains in said optical transmission line and controlling a gain of said optical amplifier to keep a light quantity of said part of the controlling light at a constant level.

2. An optical communication system according to claim 1 wherein said optical amplifier has the same gain to the communicating lights and the controlling light.

3. An optical communication system according to claim 1 wherein said control means includes a driver for varying the gain of said optical amplifier, an optical power divider for dividing portions of the communicating lights and the controlling light amplified by said optical amplifier, an optical wavelength separator for separating a portion of the controlling light from the light divided by said optical power divider, a photo-sensing circuit for sensing the light separated by said optical wavelength separator, and a gain control circuit for controlling said driver to keep the output of said photo-sensing circuit at a predetermined level.

4. An optical communication system according to claim 1 wherein said optical transmitter continuously transmits the controlling light.

5. An optical communication system according to claim 1 wherein the communicating lights are modulated with said signals at a predetermined duty factor by said optical communication apparatus, and the controlling light is modulated with a constant signal of the same duty factor as the duty factor of the communicating lights by said optical communication apparatus.

6. An optical communication system according to claim 1 wherein each of said optical communication apparatus is connected to the optical transmission line through an optical node.

7. An optical communication system according to claim 1 wherein said optical amplifier is a semiconductor laser amplifier.

8. An optical communication system comprising:
   a plurality of optical communication apparatuses for communicating signals by using a light having a first wavelength;
   an optical transmitter for transmitting a light having a second wavelength different than the first wavelength, the second wavelength light being transmitted independently of any communicating from the plurality of communication apparatuses;
   an optical transmission line for interconnecting said optical transmitters and said plurality of optical communication apparatuses to transmit the lights having the first wavelength and the second wavelength;
   an optical amplifier for amplifying the lights having the first wavelength and the second wavelength transmitted over the optical transmission line; and
   control means for taking a part of the light having the second wavelength amplified by said optical amplifier so that the rest of the light having the second wavelength remains in said optical transmission line and controlling a gain of said optical amplifier to keep a light quantity of said part of the light having the second wavelength at a constant level.

9. An optical communication system according to claim 8 wherein said plurality of optical communication apparatus further communicate signals having a third wavelength different than the first wavelength or the second wavelength.

10. An optical communication system according to claim 8 wherein said optical amplifier has the same gain to the lights having the first wavelength and the second wavelength.

11. An optical communication system according to claim 8 wherein said control means including a driver for varying the gain of said optical amplifier, an optical power divider for dividing portions of the lights having the first wavelength and the second wavelength amplified by said optical amplifier, an optical wavelength separator for separating a portion of the light having the second wavelength from the light divided by said optical power divider, a photo-sensing circuit for sensing the light having the second wavelength separated by said optical wavelength separator, and a gain control circuit for controlling said driver to keep the output of said photo-sensing circuit at a predetermined level.

12. An optical communication system according to claim 8 wherein said optical transmitter continuously transmits the light having the second wavelength.

13. An optical communication system according to claim 8 wherein the lights having the first wavelength are modulated with said signals at a predetermined duty factor by said optical communication apparatus, and the light having the second wavelength is modulated with a constant signal of the same duty factor as that of the lights having the first wavelength by said optical communication apparatus.

14. An optical communication system according to claim 8 wherein each of said optical communication apparatus is connected to the optical transmission line through an optical node.

15. An optical communication system according to claim 8 wherein said optical amplifier is a semiconductor laser amplifier.

16. An optical communication method in an optical communication system having a plurality of optical communication apparatuses, an optical transmission line for interconnecting said communication apparatuses and an optical amplifier arranged in said optical transmission line, comprising the steps of:

communicating signals among said optical communication apparatuses over said optical transmission line by using a plurality of communicating lights having different wavelengths;

transmitting a controlling light having a wavelength different than any of said plurality of wavelengths over said optical transmission line, the controlling light being transmitted independently of any communicating from the plurality of optical communication apparatuses;

amplifying the communicating lights and the controlling light transmitted over said optical transmission line by said optical amplifier;

taking a part of the controlling light amplified by said optical amplifier so that the rest of the controlling light remains in said transmission line; and controlling a gain of said optical amplifier to keep a light quantity of said part of the controlling light amplified by said optical amplifier at a constant level.

17. An optical communication method according to claim 16 wherein said optical amplifier has the same gain to the communicating lights and the controlling light.

18. An optical communication method according to claim 16 wherein said controlling light is continuously transmitted over said optical transmission line.

19. An optical communication method according to claim 16 wherein the communicating lights are modulated with said signals at a predetermined duty factor by said optical communication apparatus, and the controlling light is modulated with a constant signal of the same duty factor as the duty factor of the communicating lights by said optical communication apparatus.

20. An optical amplifier apparatus used in an optical communication system having a plurality of optical communication apparatuses for communicating signals by using a plurality of communicating signals having different wavelengths, an optical transmitter for transmitting a controlling light having a wavelength different than any of said plurality of wavelengths, and an optical transmission line for interconnecting said optical transmitter and said plurality of optical communication apparatuses to transmit the communicating lights and the controlling light, comprising:

an optical amplifier for amplifying the communicating lights and the controlling light transmitted over the optical transmission line; and control means for taking a part of the controlling light amplified by said optical amplifier so that the rest of the controlling light remains in said optical transmission line and controlling a gain of said optical amplifier to keep a light quantity of said part of the controlling light at a constant level, wherein the controlling light is transmitted independently of any communicating from the plurality of optical communication apparatuses.

21. An optical amplifier apparatus according to claim 20 wherein said optical amplifier has the same gain to the communicating lights and the controlling light.

22. An optical amplifier apparatus according to claim 20 wherein said control means includes a driver for varying the gain of said optical amplifier, an optical power divider for dividing portions of the communicating lights and the controlling light amplified by said optical amplifier, an optical wavelength separator for separating a portion of the controlling light from the light divided by said optical power divider, a photo-sensing circuit for sensing the light separated by said optical wavelength separator, and a gain control circuit for controlling said driver to keep the output of said photo-sensing circuit at a predetermined level.

23. An optical amplifier apparatus according to claim 20 wherein said optical amplifier is a semiconductor laser amplifier.

* * * * *

UNITED STATES PATENT AND TRADEMARK OFFICE
CERTIFICATE OF CORRECTION

PATENT NO. : 5,396,360
DATED : March 7, 1995
INVENTOR(S) : MASAO MAJIMA

It is certified that error appears in the above-identified patent and that said Letters Patent is hereby corrected as shown below:

ON TITLE PAGE

In [56] References Cited, under U.S. PATENT DOCUMENTS:
"5,117,196 3/1992 Epworth et al." should read
--5,117,196 5/1992 Epworth et al.--.

In [56] References Cited, under FOREIGN PATENT DOCUMENTS:
"0445364 10/1990 Germany" should read
--0445364 11/1991 Fed. Rep. of Germany--;
"01034030 2/1989 Japan" should read
--1-034030 2/1988 Japan--; and
"02119328 5/1990 Japan" should read
--2-119328 5/1990 Japan--.

In [56] References Cited, under OTHER PUBLICATIONS:
"No.11," (second occurrence) should be deleted and
"York" should read --York,--.

COLUMN 4

Line 4, "a" (second occurrence) should read --an--.
Line 40, "wave length" should read --wavelength--.

COLUMN 7

Line 54, "claim 1" should read --claim 1,--.
Line 57, "claim 1" should read --claim 1,--.

UNITED STATES PATENT AND TRADEMARK OFFICE
CERTIFICATE OF CORRECTION

PATENT NO. : 5,396,360

DATED : March 7, 1995

INVENTOR(S) : MASAO MAJIMA

It is certified that error appears in the above-identified patent and that said Letters Patent is hereby corrected as shown below:

COLUMN 8

Line 2, "claim 1" should read --claim 1,--.
Line 5, "claim 1" should read --claim 1,--.
Line 12, "claim 1" should read --claim 1,--.
Line 16, "claim 1" should read --claim 1,--.
Line 43, "claim 8" should read --claim 8,--.
Line 48, "claim 8" should read --claim 8,--.
Line 52, "claim 8" should read --claim 8,--.
Line 65, "claim 8" should read --claim 8,--.
Line 68, "claim 8" should read --claim 8,--.

COLUMN 9

Line 8, "claim 8" should read --claim 8,--.
Line 12, "claim 8" should read --claim 8,--.
Line 41, "claim 16" should read --claim 16,--.
Line 45, "claim 16" should read --claim 16,--.
Line 48, "claim 16" should read --claim 16,--.

UNITED STATES PATENT AND TRADEMARK OFFICE
CERTIFICATE OF CORRECTION

PATENT NO. : 5,396,360
DATED : March 7, 1995
INVENTOR(S) : MASAO MAJIMA

It is certified that error appears in the above-identified patent and that said Letters Patent is hereby corrected as shown below:

COLUMN 10

Line 30, "20" should read --20,--.
Line 33, "20" should read --20,--.
Line 46, "20" should read --20,--.

Signed and Sealed this

Twenty-ninth Day of August, 1995

BRUCE LEHMAN

Attest:

*Attesting Officer*　　　*Commissioner of Patents and Trademarks*